United States Patent
Lin et al.

(10) Patent No.: US 7,813,142 B2
(45) Date of Patent: Oct. 12, 2010

(54) PORTABLE ELECTRONIC DEVICE WITH CONDUCTING POLE

(75) Inventors: Kuan-Chang Lin, Tu-Cheng (TW); Ting-Chang Chang, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 437 days.

(21) Appl. No.: 11/952,973

(22) Filed: Dec. 7, 2007

(65) Prior Publication Data

US 2009/0020312 A1    Jan. 22, 2009

(30) Foreign Application Priority Data

Jul. 20, 2007    (CN) .................... 2007 1 0076090

(51) Int. Cl.
*H01R 9/00*    (2006.01)

(52) U.S. Cl. .................... 361/772; 361/760; 361/773; 361/774; 361/787; 361/791

(58) Field of Classification Search ......... 361/772–774, 361/776, 769, 770, 785–787, 791; 439/591, 439/595, 700, 246–248, 70, 66, 91, 22, 935, 439/75, 824, 709, 59, 71–72, 412, 83; 324/761, 324/754, 762

See application file for complete search history.

(56) References Cited

U.S. PATENT DOCUMENTS

| | | | | |
|---|---|---|---|---|
| 5,993,269 | A * | 11/1999 | Ito .............................. | 439/824 |
| 6,844,748 | B2 * | 1/2005 | Sato et al. ................... | 324/754 |
| 7,282,378 | B2 * | 10/2007 | Yoshida ....................... | 438/18 |
| 7,362,118 | B2 * | 4/2008 | Henry et al. ................. | 324/761 |
| 7,471,096 | B2 * | 12/2008 | Kohashi et al. ............. | 324/755 |
| 2006/0189177 | A1 * | 8/2006 | Goodman et al. ............. | 439/70 |

FOREIGN PATENT DOCUMENTS

JP    2002-343479 A    11/2002

* cited by examiner

*Primary Examiner*—Dameon E Levi
*Assistant Examiner*—Hoa C Nguyen
(74) *Attorney, Agent, or Firm*—Jeffrey T. Knapp

(57) ABSTRACT

A portable electronic device (20) includes a circuit board (21) and at least one conducting pole (22). The conducting pole is mounted on the circuit board and includes a breakable portion (2224), the breakable portion is configured to be the part that breaks when the conducting pole is crumpled.

14 Claims, 4 Drawing Sheets

PORTABLE ELECTRONIC DEVICE WITH CONDUCTING POLE

BACKGROUND OF THE INVENTION

1. Field of the Invention

The present invention generally relates to portable electronic devices, and, particularly, to a portable electronic device with at least one conducting pole.

2. Description of Related Art

Nowadays, portable electronic devices, such as mobile phones, laptops and personal digital assistants (PDAs) are widely used. Generally, a circuit board is a main component within a portable electronic device. When the portable electronic device is in use, it is prone to cause electrostatic charges, thus damages the circuit board within. Therefore, most portable electronic devices have grounding apparatuses configured to prevent the electrostatic charges from damaging the circuit boards.

Referring to FIG. 4, a typical portable electronic device 10 includes a circuit board 11, a plurality of conducting poles 12, a cover board 13 and a plurality of circuit components 14. The cover board 13 is configured to be a part of a housing of the portable electronic device 10 and protects the circuit board 11. The conducting poles 12 are electronically connected to the circuit board 11 and stably support the cover board 13 in a proper position. The circuit components 14 are mounted on the circuit board 11.

The circuit board 11 includes a conducting layer 111, an insulated layer 112, a grounding layer 113 and a plurality of conducting members 114. The conducting layer 111 is configured to be patterns of circuit which cover a portion of the insulated layer 112. The insulated layer 112 is formed between the conducting layer 111 and the grounding layer 113. The circuit board 11 defines a plurality of conducting apertures 115 corresponding with the conducting members 114 and running through the insulated layer 112. The conducting members 114 are conductive portions formed on the grounding layer 113 and electronically connected to the grounding layer 113, each conducting member 114 exposes from its corresponding conducting aperture 115. The conducting poles 12 are inserted into the conducting apertures 115 and thus are electronically connected to the conducting members 114. In this way, the electrostatic charges of the cover board 13 can be transferred to the grounding layer 113 via the conducting poles 12 and the conducting members 114.

However, after the conducting poles 12 are mounted in the conducting apertures 15, the cover board 13 is assembled with the circuit board 11. Since the conducting poles 12 are protruding from the conducting apertures 115, the cover board 13 may crash the conducting poles 12 in assembly or in use. The crumpled conducting poles 12 may be distorted by the crash, and the insulated layer 112 and the conducting members 114 connected to the conducting poles 12 may also be distorted by the distorted inserting conducting poles 12. Thus, the circuit board 11 may be badly damaged. Furthermore, it is difficult to repair the distorted portions in the conducting aperture 115 of the circuit board 11 and the distorted conducting members 114, which slow down the assembly process.

Therefore, an improved portable electronic device is desired in order to overcome the above-described shortcomings.

SUMMARY OF THE INVENTION

In one embodiment thereof, a portable electronic device includes a circuit board and at least one conducting pole. The conducting pole is mounted on the circuit board and includes a breakable portion, the breakable portion is configured to be the part that breaks when the conducting pole is crumpled.

Other novel features will become more apparent from the following detailed description when taken in conjunction with the accompanying drawings.

BRIEF DESCRIPTION OF THE DRAWINGS

Many aspects of the portable electronic device can be better understood with reference to the following drawings. The components in the drawings are not necessarily drawn to scale, the emphasis instead being placed upon clearly illustrating the principles of the present portable electronic device. Moreover, in the drawings, like reference numerals designate corresponding parts throughout the several views.

DETAILED DESCRIPTION OF THE INVENTION

Figure 1:
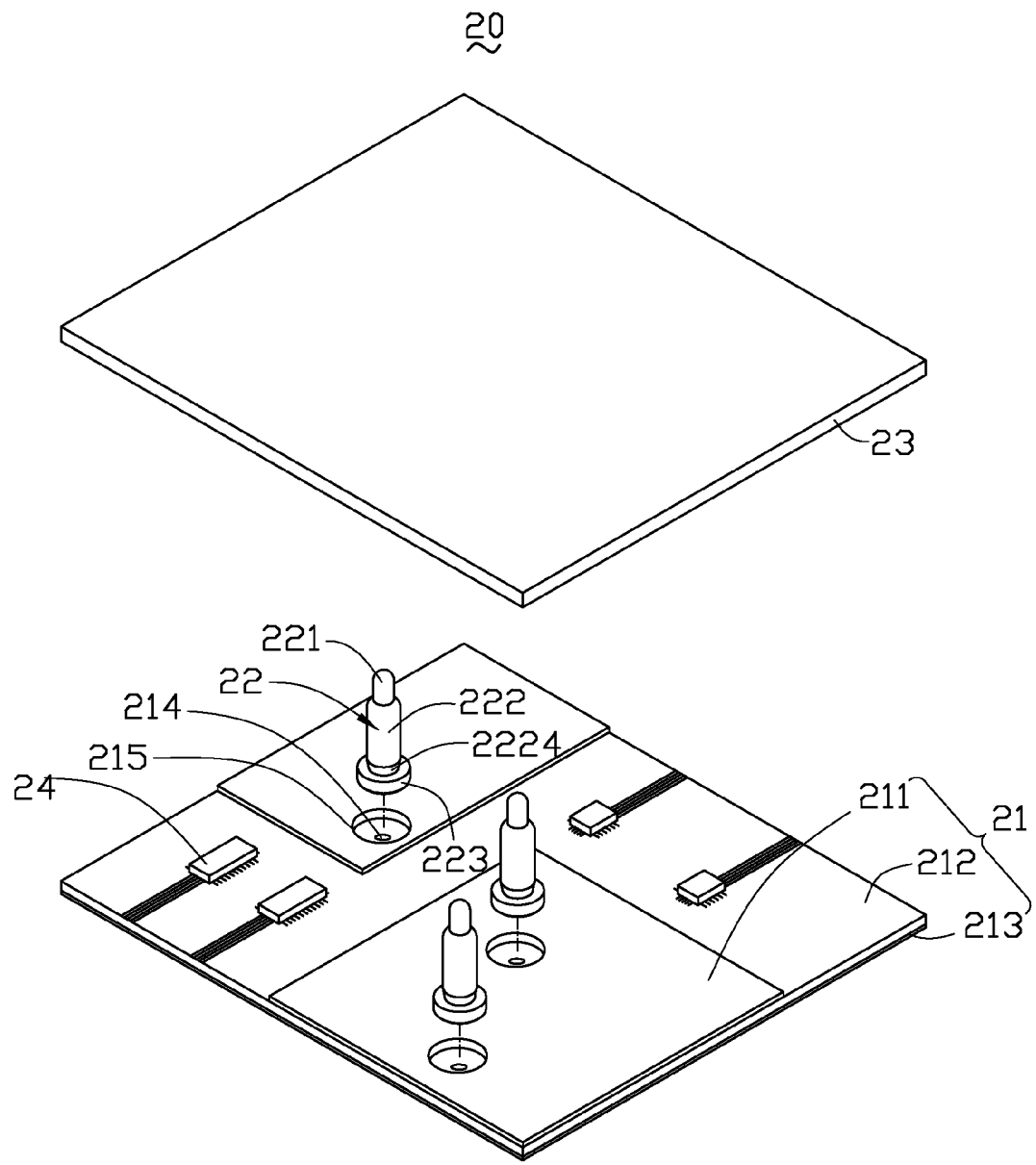
FIG. 1 is an exploded view of a portable electronic device in accordance with a present embodiment.
Figure 2:
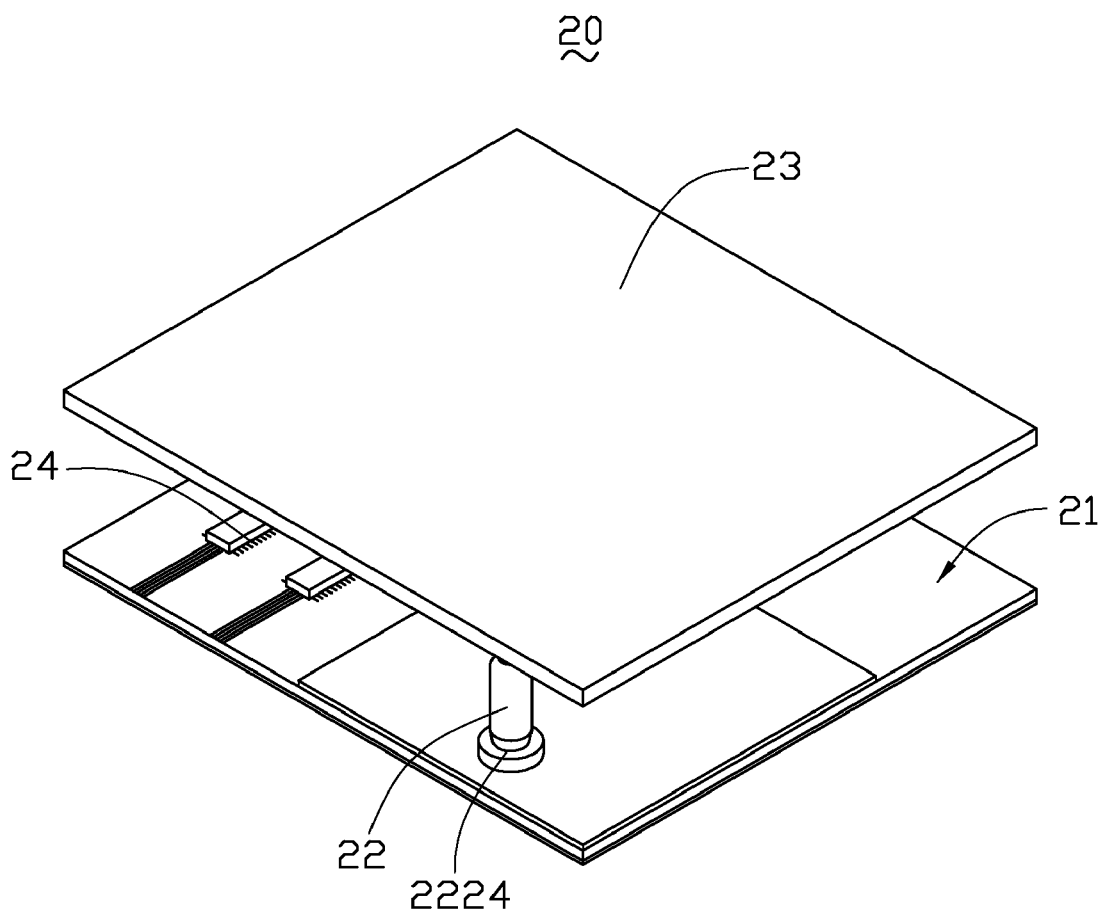
FIG. 2 is an assembled view of the portable electronic device shown in FIG. 1.

Referring to FIG. 1 and FIG. 2, a portable electronic device 20 according to a first embodiment of the present invention is provided. The portable electronic device 20 can be mobile phones, laptops, and personal digital assistants (PDAs), etc. The portable electronic device 20 includes a circuit board 21, a plurality of conducting poles 22 mounting on the circuit board 21, a cover board 23 supported by the conducting poles 22 and a plurality of circuit components 24 mounted on the circuit board 21. The cover board 23 is configured to be a part of a housing of the portable electronic device 20 and protects the circuit board 21. The conducting poles 22 are mounted to the circuit board 21 and support the cover board 23. The circuit components 24 can be resistors, capacitors, or transistors, etc.

The circuit board 21 includes a conducting layer 211, an insulated layer 212, a grounding layer 213 and a plurality of conducting members 214. The insulated layer 212 is formed between the conducting layer 211 and the grounding layer 213. The circuit 21 defines a plurality of conducting apertures 215 corresponding to the conducting members 214 and running through the insulated layer 212. The conducting members 214 are conductive portions partially formed on the grounding layer 213 and partially received in the conducting apertures 215. The conducting members 214 are electronically connected to the grounding layer 213, and each conducting member 214 has a portion exposes from its corresponding conducting aperture 215. The conducting poles 22 are inserted into the conducting apertures 215 and electronically connected to the conducting members 214.

The conducting layer 211 is formed by metal such as copper, silver, tin, etc. The conducting layer 211 is configured to be patterns of circuit which cover a portion of the insulated layer 212. The circuit components 24 are mounted on the conducting layer 211.

The insulated layer 212 is formed by insulated materials, such as plastics or epoxy, etc. The insulated layer 212 is configured to cover the grounding layer 213 to prevent short circuit from occurring between the conducting layer 211 and the grounding layer 213.

The grounding layer 213 is also formed by metal such as copper, silver, tin, etc. The grounding layer 213 is configured for transmitting the electrostatic charges of the portable electronic device 20 to ground to protect the circuit board 21.

The conducting members 214 are formed by metal such as copper, silver, tin, etc. The conducting members 214 are configured to electronically connect the grounding layer 213 to the conducting poles 22.

Figure 3:
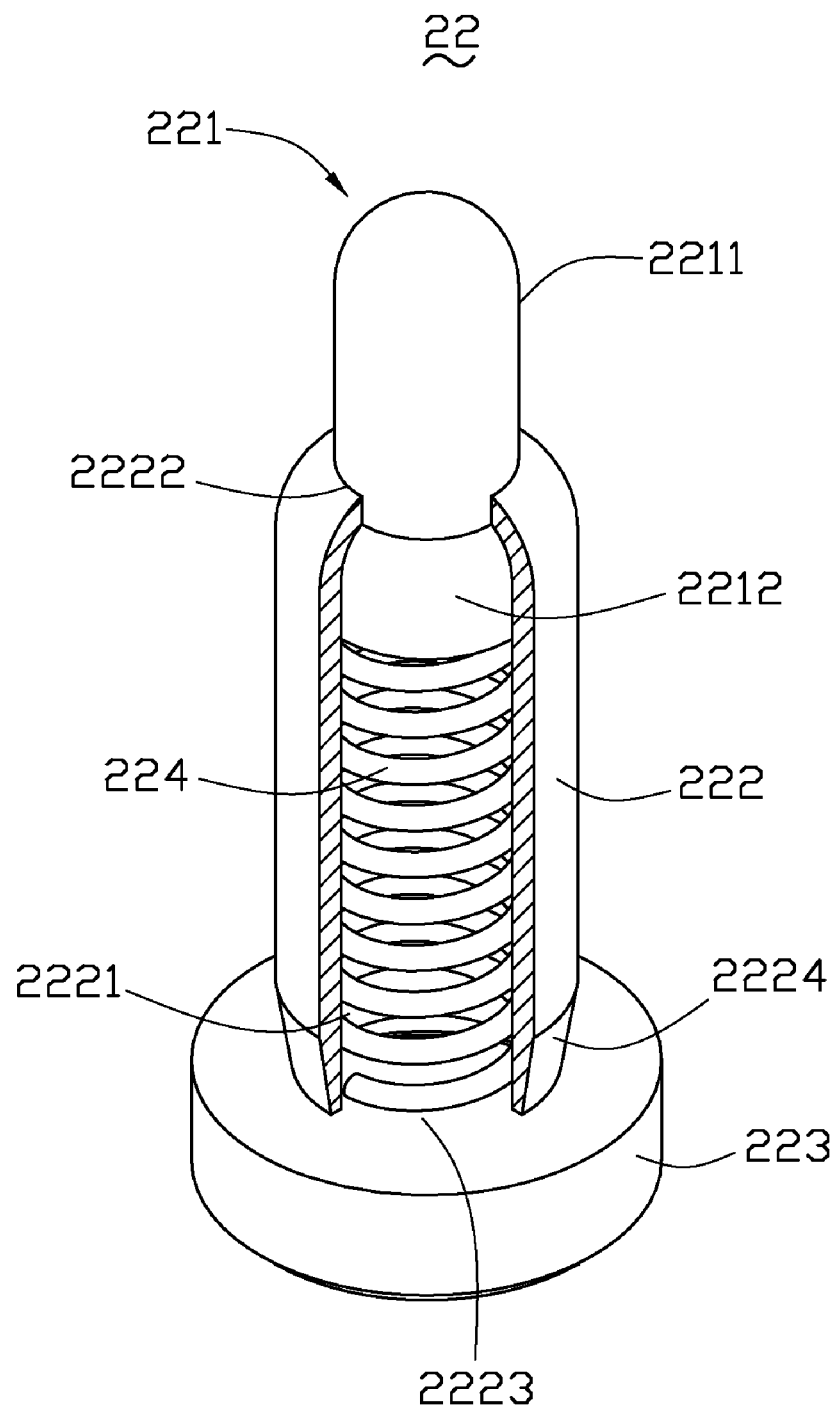
FIG. 3 is a cut-away view of the conducting pole shown in FIG. 1.
Figure 4:
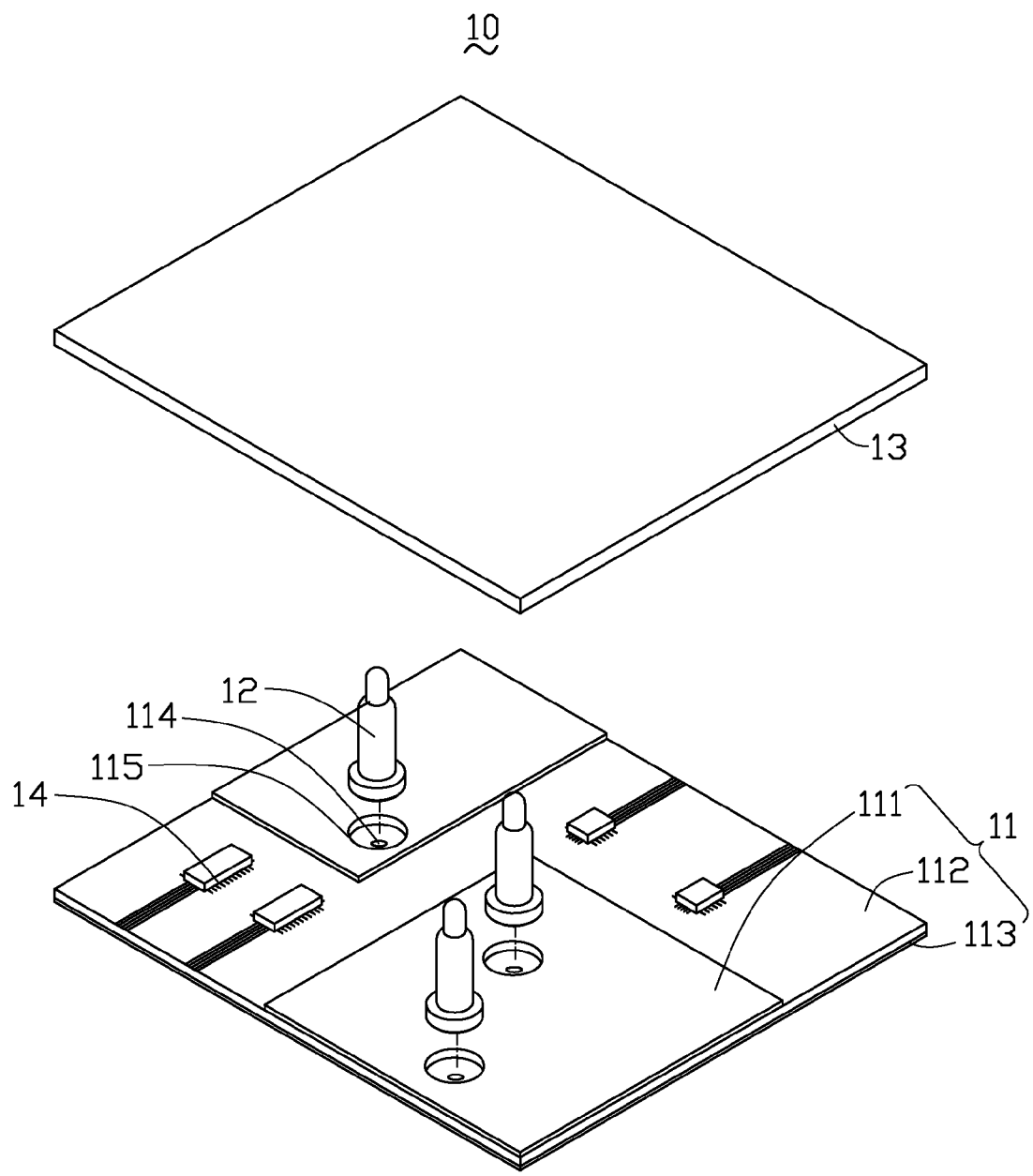
FIG. 4 is an exploded view of a typical portable electronic device with conducting poles.

Also referring to FIG. 3, the conducting poles 22 are formed by metal such as copper, silver, tin, etc. Each conducting pole 22 includes a head member 221, a containing member 222, a connecting member 223 and a resilient member 224. The head member 221 is movably mounted on one end the containing member 222, and the connecting member 223 is connected to an end opposite to the end mounting the head member 221 of the containing member 222.

The head member 221 includes a supporting portion 2211 and a mounting portion 2212 connected to the supporting portion 2211. A diameter of the supporting portion 2211 is less than that of the mounting portion 2212.

The containing member 222 is a hollow cylinder. The containing member 222 defines a cylindrical containing cavity 2221 in its central portion, and respectively defines a first open end 2222 and a second open end 2223 corresponding to the containing cavity 2221 at both ends. An inner diameter of the first open end 2222 is approximately equal to the diameter of the supporting portion 2211. An outer diameter of the containing member 222 decreases from its middle portion to the end defining the second open end 2223, thus a cuneal breakable portion 2224 is formed adjacent to the second open end 2223. In this way, a thickness of the breakable portion 2224 is configured to be less than that of any other part of the containing member 222, and the containing member 222 has the least thickness at an end of the breakable portion 2224, i.e., the second open end 2223 of the containing member 222.

The connecting member 223 is shaped as a column having a diameter approximately equal to the inner diameter of the conducting apertures 215. The resilient member 224 is a columnar spring.

In assembly, the head member 221 is inserted into the containing cavity 2221 from the second open end 2223, and the supporting portion 2211 extends out from the first open end 2222. The resilient member 24 is inserted into the containing cavity 2221 from the second open end 2223, and the mounting portion 2212 blocks one end of the resilient member 224. The connecting member 223 is mounted to the end having the least thickness of the breakable portion 2224, i.e., the second open end 2223 of the containing member 222, and the connecting member 223 blocks another end of the resilient member 24. In this way, a conducting pole 22 is assembled.

Each conducting poles 22 is inserted into a conducting aperture 215. The connecting member 223 is partially contained in the conducting aperture 215 and electronically connected to the conducting member 214 contained in the conducting aperture 215.

The cover board 23 covers the circuit board 21. The conducting poles 22 are electronically connected to the cover board 23. The supporting portion 2211 of each conducting pole 22 stably supports the cover board 23 in a proper position. In this way, the circuit board 21 and the cover board 23 are assembled together. In use, the electrostatic charges of the cover board 23 can be transferred to the grounding layer 213 via the conducting poles 22 and the conducting members 214.

Understandably, in assembly or in use, the cover board 23 may cause damages to the conducting poles 22. However, since a thickness of the breakable portion 2224 is less than that of any other part of the conducting pole 22, when a conducting pole 22 is impacted, the breakable portion 2224 is likely to be the part that breaks first, thus the containing member 222 breaks away from the connecting member 223 to prevent circuit board 21 from being damaged by the conducting poles 22. The broken conducting poles 22 can be easily mounted to the circuit board 21 again via sealing or gluing.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A portable electronic device, comprising:
   a circuit board; and
   at least one conducting pole mounted on the circuit board, the conducting pole including a hollow containing member that includes two opposite open ends and a breakable portion formed adjacent to one of the two open ends, wherein a thickness of the breakable portion is decreased, such that the breakable is broken first due to its decreased thickness when the conducting pole is impacted.

2. The portable electronic device as claimed in claim 1, wherein, the containing member is a hollow cylinder, an outer diameter of the containing member decreasing from its middle portion to one end thereof to form the breakable portion.

3. The portable electronic device as claimed in claim 2, wherein a thickness of the breakable portion is less than that of any other part of the containing member.

4. The portable electronic device as claimed in claim 3, wherein the conducting pole includes a connecting member connected to the breakable portion.

5. The portable electronic device as claimed in claim 4, wherein the conducting pole includes a head member and a resilient member, the containing member defining a containing cavity therein, the resilient member being contained in the containing cavity, one end of the resilient member being blocked by the head member and another end of the resilient member being blocked by the connecting member.

6. The portable electronic device as claimed in claim 4, wherein the circuit board includes a conducting layer, an insulated layer and a grounding layer, the insulated layer being formed between the conducting layer and the grounding layer.

7. The portable electronic device as claimed in claim 6, wherein the circuit board defines at least one conducting aperture running through the insulated layer therein, and the connecting member is partially contained in the conducting aperture.

8. The portable electronic device as claimed in claim 7, wherein the circuit board includes at least one conducting member contained in the conducting aperture and electronically connected to the grounding layer.

9. The portable electronic device as claimed in claim 8, wherein the portable electronic device includes a cover board configured to be a part of the housing of the portable electronic device, supported by the head member and electronically connected to the conducting pole.

10. A conducting pole, comprising:
- a hollow containing member, the containing member including two opposite open ends and a breakable portion formed adjacent to one of the two open ends, wherein a thickness of the breakable portion is decreased to be less than that of any other parts of the containing member, such that the breakable portion is broken first due to its decreased thickness when the conducting pole is impacted; and
- a connecting member, the connecting member being connected to an end of the containing member for electronic connection.

11. The conducting pole as claimed in claim 10, wherein the connecting member is connected to the breakable portion.

12. The conducting pole as claimed in claim 11, wherein an outer diameter of the containing member decreases from its middle portion to an end to form the breakable portion.

13. The conducting pole as claimed in claim 11, wherein the connecting member is connected to an end of the breakable portion that has a thickness less than that any other part of the containing member.

14. The conducting pole as claimed in claim 10, wherein the conducting pole includes a head member and a resilient member, the containing member defining a containing cavity therein, the resilient member being contained in the containing cavity, one end of the resilient member being blocked by the head member and another end of the resilient member being blocked by the connecting member.

* * * * *